United States Patent [19]
Holbrook et al.

[11] Patent Number: 6,013,156
[45] Date of Patent: Jan. 11, 2000

[54] BUBBLE MONITOR FOR SEMICONDUCTOR MANUFACTURING

[75] Inventors: Allison Holbrook; Jiahua Huang, both of San Jose; Aaron A. Fernandes, Oakdale, all of Calif.

[73] Assignee: Advanced Micro Devices, Inc., Sunnyvale, Calif.

[21] Appl. No.: 09/034,084

[22] Filed: Mar. 3, 1998

[51] Int. Cl.[7] .................................................. C23F 1/02
[52] U.S. Cl. ...................................... 156/345; 340/825.06
[58] Field of Search ...................... 156/345; 340/825.06

[56] References Cited

U.S. PATENT DOCUMENTS 5,439,569  8/1995  Carpio .................................. 204/153.1

*Primary Examiner*—Bruce Breneman
*Assistant Examiner*—Norca L. Torres
*Attorney, Agent, or Firm*—Mikio Ishimaru

[57] ABSTRACT

Apparatus for monitoring the hydrogen peroxide concentration in a sulfuric acid bath used to remove photoresist from semiconductor wafers uses the amount of bubbles in the fluid mixture to signal the addition of hydrogen peroxide. The bubbles are directly related to the hydrogen peroxide in sulfuric acid mixture. The bubbles are sensed by a light source and photoelectric sensor connected to a threshold adjustment control which controls a metering solenoid valve to add hydrogen peroxide from a reservoir to the bath when the bubbles decrease.

20 Claims, 1 Drawing Sheet

BUBBLE MONITOR FOR SEMICONDUCTOR MANUFACTURING

TECHNICAL FIELD

The present invention relates generally to semiconductor manufacturing technology and more specifically to monitoring a processing bath for removing organic photoresist or other organic residues from semiconductor wafers.

BACKGROUND ART

There are several methods for removing, or stripping, materials such as organic photoresist or other organic residues, collectively referred to as "photoresist", from semiconductor wafers. One common method is the use of a heated hydrogen peroxide and sulfuric acid mixture. The mixture of hydrogen peroxide and sulfuric acid in a processing bath produces a volatile exothermic reaction which removes the photoresist by oxidizing the carbon in the photoresist. The carbon is liberated from the photoresist in the form of carbon dioxide gas. Some of the hydrogen peroxide is also converted to water which, depending on the bath condition, remains in the bath or boils out. The rate at which hydrogen peroxide is exhausted from the bath is dependent on the temperature, photoresist content, and acid concentration.

It is important to maintain the correct mixture of hydrogen peroxide and sulfuric acid so that consistent photoresist stripping is obtained. A traditional method for insuring consistent hydrogen peroxide to sulfuric acid mixture is to observe the processing bath for bubbles. Vigorous bubbling indicates an adequate amount of hydrogen peroxide to remove, or strip, the photoresist. Over time and usage, the hydrogen peroxide concentration will diminish so constant operator attention to the bath is needed to ensure consistent bubble activity.

Most modern processing baths are designed with covers so a visual inspection of the bath condition is not easily done. These newer systems usually add hydrogen peroxide to the bath on a time or wafer batch basis which can be costly or inadequate. If the bath is idle and chemicals are being added on a time basis, expensive chemicals are being wasted. Also the bath could become too diluted with water. Wafer batch addition of hydrogen peroxide can be inadequate because the hydrogen peroxide concentration decreases over time requiring more hydrogen peroxide as time increases between batches. If the time between batches is sporadic, the amount of hydrogen peroxide is difficult to determine. Both time and batch addition of hydrogen peroxide also fail to compensate for varying amounts of photoresist on the wafers. More photoresist on the wafers will consume more hydrogen peroxide.

Analytical testing systems which measure the proportion of hydrogen peroxide to sulfuric acid are expensive. Further, most of these systems require the mixture to be at around room temperature so they can not be used as a part of a real-time control system. A simple system is required which can monitor the bath and feed back of this information so that a consistent mixture can be maintained throughout the wafer processing.

A solution for solving this problem simply and inexpensively has been long sought by and eluded those skilled in the art.

DISCLOSURE OF THE INVENTION

The present invention provides a system for monitoring the bubbles in a semiconductor bath and controlling the amount of chemical added to the bath to remove photoresist from semiconductor wafers. The bubbles are directly related to the concentration of hydrogen peroxide in the hydrogen peroxide and sulfuric acid mixture. The bubbles are sensed by using a light source and photoelectric sensor combination connected to a threshold adjustment control which controls a metering solenoid valve to add hydrogen peroxide from a reservoir when the bubbles decrease.

An advantage of the present invention is to provide a simple and inexpensive system for replacing an operator in a semiconductor manufacturing process.

A further advantage of the present invention is to provide an automatic system which monitors photoresist content and acid concentration in the wafer processing bath.

A further advantage of the present invention is to provide a system to automatically replace the photoresist removal fluid in the processing bath that is used up.

A further advantage of the present invention is to provide a system to automatically correct dilution caused by water formed while removing the photoresist.

A further advantage of the present invention is to provide a system to automatically replace the photoresist removal fluid in the processing bath that evaporates.

A further advantage of the present invention is to provide a system to automatically replace the photoresist removal fluid in the processing bath that evaporates due to temperature increases due to the exothermic reaction of the photoresist removal process.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
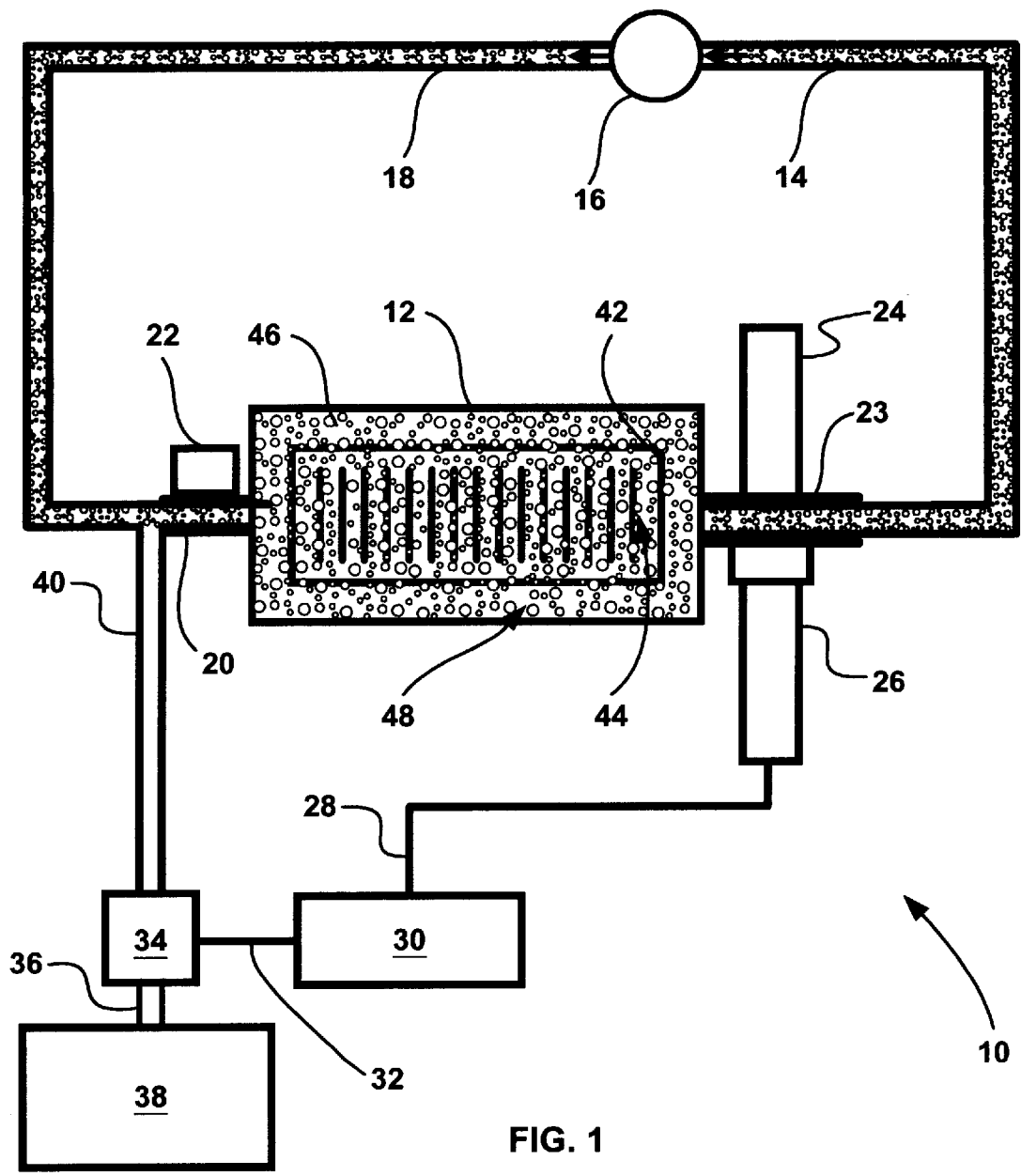
FIG. 1 is a schematic, partially in section, of the system of the present invention used in conjunction with a semiconductor wafer processing bath.

Referring now to FIG. 1, therein is shown the semiconductor wafer-processing bath and bubble monitor system 10. In the system 10 is a processing bath 12 which is shown in a cross-sectional top view schematic. The processing bath 12 is connected by a pipe 14 to a fluid recirculation pump 16 which is capable of pumping corrosive fluids. The corrosive fluid in the present invention is a mixture of sulfuric acid and hydrogen peroxide.

The output side of the fluid pump 16 is connected by a pipe 18 to a quartz pipe 20. The quartz pipe 20 is transparent and has an associated infra-red heating element 22 for heating fluid being pumped through it. This is the generally accepted conventional arrangement for a semiconductor wafer-processing bath.

The pipe 14 on the input side of the fluid pump 16 includes a quartz pipe 23. The quartz pipe 23 has a light source 24 placed so as to project a beam of light into and through it. On the opposite side of the quartz pipe 23 from the light source 24 is a receiver 26 for sensing the light beam from the light source 24. Any bubbles in the fluid in the quartz pipe 23 will deflect light from the light source 24 and cause less light to be received by the receiver 26.

The receiver 26 is a photoelectric sensor which provides an output signal as a voltage, current, or resistance directly proportional to the light input; the more light, the larger the output signal. The receiver 26 has its output signal connected by a lead 28 to a threshold adjustment control 30. From the threshold adjustment control 30, there is a trigger signal line 32 connected to control a metering solenoid valve 34. The metering solenoid valve 34 meters a second fluid, hydrogen peroxide, through a pipe 36 from a chemical reservoir 38 through a pipe 40 to the pipe 18 where it mixes with the fluid in the pipe 18 and passes through the quartz pipe 20 into the processing bath 12.

It should be understood that the present invention utilizes a light and photoelectric sensor primarily because of their low cost. Other alternatives would be evident to those skilled in the art such as a videocamera being the receiver 26 and ambient light being the light source 24. The image seen by the videocamera would be used to provide the output signal for the threshold adjustment control 30. Inside the processing bath 12 are shown a wafer carrier 42 which contains semiconductor wafers 44. Both the wafer carrier 42 and the semiconductor wafers 44 are immersed in a heated hydrogen peroxide and sulfuric acid mixture 46 having bubbles 48.

Figure 2:
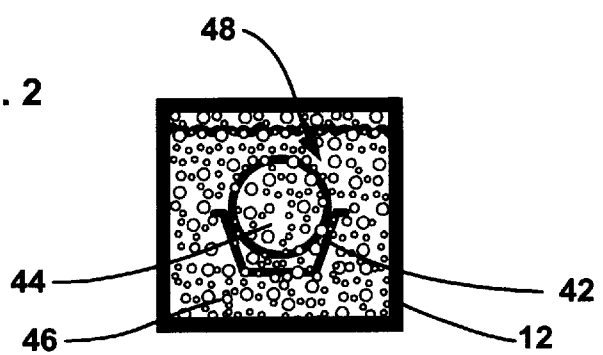
FIG. 2 is a schematic, partially in section, of a front view of the present invention with the top view of the semiconductor wafers shown.

Referring now to FIG. 2, therein is shown a cross-sectional front view schematic of the processing bath 12. Inside the processing bath 12 are shown the wafer carrier 42 and the semiconductor wafers 44. The surfaces of the semiconductor wafers 44 would have various materials (not shown), such as wafer protective coatings and photoresist (collectively, organic photoresist and residues), which is to be removed by the system 10. As shown, the wafer carrier 42 and the semiconductor wafers 44 are immersed in the mixture 46. Inside and rising from the mixture 46 are the bubbles 48 due both to the removal of the materials as well as the chemical reaction of the sulfuric acid and hydrogen peroxide.

In operation, the processing bath 12 is filled with the mixture 46 of hydrogen peroxide ($H_2O_2$) and sulfuric acid ($H_2SO_4$). The mixture is recirculated through by the pump 16 and is heated within a 90° C. to 130° C. range by the heater 22. In the preferred mode, the receiver 26 is down flow from the processing bath 12 at the quartz pipe 23.

During the initial system startup, the threshold signal which will activate the metering solenoid valve 34 will need to be determined. One means could be to observe the amount of bubbles and correlating these bubbles to wafer cleanliness. The light source 24 will be shining a light beam through the bubbles 48 passing through the quartz pipe 20. The bubbles 48 due to the reaction of the hydrogen peroxide and sulfuric acid which cross the path of the light beam will deflect and diffuse some light resulting in different illumination levels at the receiver 26. The illumination level will be approximately inversely proportional to the amount of bubbles; the fewer the bubbles, the greater the illumination. Once the threshold signal has been determined, the system is ready for processing wafers on a completely autonomous basis with no further operator intervention.

When the amount of bubbles is too little as determined by the threshold adjustment setup, the receiver 26 measures a high level of illumination and then sends a high signal to the threshold adjustment control 30. This will send a trigger signal over the trigger signal line 32 to the metering solenoid valve 34. The metering solenoid valve 34 will open to let hydrogen peroxide flow from the chemical reservoir 38 through the pipes 36, 40, 18, and 20 into the processing bath 12. The addition of the hydrogen peroxide will increase the amount of bubbles, which is indicative of an adequate amount of hydrogen peroxide being present to properly strip the photoresist off the wafers 44. The increased number of bubbles will also decrease the light received by the receiver 26, which automatically decreases the output signal to the threshold adjustment control 30 until the threshold is reached because the appropriate amount of illumination is present.

When the desired ratio of hydrogen peroxide to sulfuric acid is reached, the threshold adjustment control 30 will act to turn off the metering solenoid valve 34 and stop the addition of hydrogen peroxide.

When the wafer carrier 42 and wafers 44 are lowered into the processing bath 12, the photoresist starts to be oxidized. This oxidation removes the photoresist ($C_xH_y$) in a volatile exothermic reaction of the hydrogen peroxide with the carbon in the photoresist to form the carbon dioxide and water. As the oxidation reaction progresses, the amount of hydrogen peroxide in the mixture 46 decreases.

There are a number of different factors that also decrease the amount of hydrogen peroxide in the mixture 46 in addition to the amount of photoresist in the different batches of wafers.

The temperature of the mixture 46 is one factor which causes hydrogen peroxide to decrease at varying rates. At higher temperatures which may be due to the exothermic reaction, hydrogen peroxide decomposes faster and more water boils out. There is a complex relationship here since the decomposition decreases the proportion of hydrogen peroxide while the water boiling out increases the proportion. At lower temperatures, less of the water from the oxidation reaction is boiled out of the processing bath 12, and this causes the decomposition to slow but also causes the processing bath to become diluted with water. Too much water in a processing bath can make it ineffective and stop the stripping action.

Time between batches of wafers is another factor which can affect the ratio of the mixture 46. Over time at a constant temperature, the hydrogen peroxide can decompose. Similarly, with time, there will be a more complete reaction with removed photoresist and more complete usage of the hydrogen peroxide. If the time between batches is sporadic, the amount of hydrogen peroxide in the mixture becomes extremely difficult to determine.

As the amount of hydrogen peroxide drops in the processing bath 12, so does the amount of bubbles 48. Therefore, by automatically maintaining the amount of bubbles, the amount of hydrogen peroxide, which is directly proportional, can be automatically maintained. Since the amount of bubbles is inversely proportional to the light passing though the mixture 46, the receiver 26 will output its maximum signal when the bubbles 48 are at a minimum. Thus, the threshold adjustment control 30 can be set to provide a specific ratio of hydrogen peroxide to sulfuric acid and water for the photoresist covering the specific wafers 44 properly. Whenever the bubbles are reduced from the ideal threshold, the metering solenoid valve 34 will open to add hydrogen peroxide from the reservoir 38.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the appended claims. All matters set forth herein or shown in the accompanying drawings are to be interpreted in an illustrative and non-limiting sense.

The invention claimed is:

1. Apparatus for monitoring a processing bath having a fluid which contains bubbles during operation, comprising:

a fluid reservoir connected to said processing bath containing fluid;

a metering mechanism connected between and metering fluid from said fluid reservoir to the processing bath;

a signal source providing a signal into the fluid, said signal modified by the bubbles;

a signal receiver receiving the modified signal from the fluid, said signal receiver generating an output signal responsive to said modified signal from the fluid; and an adjustment control connected to said metering mechanism for receiving said output signal and settable to cause said metering mechanism to meter fluid from said fluid reservoir to said processing bath in response to the output signal.

2. The apparatus as claimed in claim 1 wherein the fluid in the processing bath is used for removing materials from semiconductor wafers immersed in the processing bath and the bubbles change as the fluid is used up removing the protective coatings; and wherein said adjustment control is settable to cause said metering mechanism to replace the fluid in the processing bath that is used up.

3. The apparatus as claimed in claim 1 wherein the fluid in the processing bath is used for removing materials from semiconductor wafers and the bubbles change as the fluid becomes diluted by a second fluid formed while removing the materials; and wherein said adjustment control is settable to cause said metering mechanism to replace the fluid in the processing bath to decrease the dilution of the fluid therein.

4. The apparatus as claimed in claim 1 wherein the bubbles change as the fluid in the processing bath is lost over time; and wherein said adjustment control is settable to cause said metering mechanism to replace the fluid in the processing bath that is lost over time.

5. The apparatus as claimed in claim 1 wherein the bubbles change as the fluid in the processing bath is lost faster at higher temperatures; and wherein said adjustment control is settable to cause said metering mechanism to replace the fluid in the processing bath that is lost at higher temperatures.

6. The apparatus as claimed in claim 1 wherein said signal source operates in the electro-magnetic spectrum.

7. The apparatus as claimed in claim 1 wherein said output signal from said receiver is inversely proportional to said modified signal.

8. Apparatus for monitoring a processing bath capable of containing a fluid mixture of at least two components which contains bubbles during operation proportional to the ratio of the two components, comprising:

a reservoir connected to said processing bath capable of containing one of the two components;

a metering mechanism connected between and for metering the component from said reservoir to the processing bath;

a signal source capable of providing a signal into the fluid mixture, said signal inversely proportional to the amount of the bubbles;

a signal receiver capable of receiving the signal from the fluid mixture, said signal receiver generating an output signal responsive to said signal from the fluid mixture; and an adjustment control connected to said metering mechanism for receiving said output signal and settable to cause said metering mechanism to meter the component from said reservoir to said processing bath at a settable output signal to maintain the ratio of the two components.

9. The apparatus as claimed in claim 8 wherein the component in the reservoir is used for removing protective coatings from semiconductor wafers immersed in the processing bath and the amount of bubbles decrease as the component is used up removing the protective coatings; and wherein said adjustment control is settable to cause said metering mechanism to replace the component from the reservoir in the processing bath that is used up.

10. The apparatus as claimed in claim 8 wherein the component in the reservoir is used for removing protective coatings from semiconductor wafers and the amount of bubbles decrease as the fluid mixture becomes diluted by a third component formed while removing the protective coatings; and wherein said adjustment control is settable to cause said metering mechanism to replace the component from the reservoir in the processing bath to decrease the dilution therein.

11. The apparatus as claimed in claim 8 wherein the amount of bubbles decrease as the component from the reservoir in the processing bath decomposes over time; and wherein said adjustment control is settable to cause said metering mechanism to replace the fluid in the processing bath that decomposes.

12. The apparatus as claimed in claim 8 wherein the amount of bubbles decrease as the component from the reservoir in the processing bath decomposes faster at higher temperatures; and wherein said adjustment control is settable to cause said metering mechanism to replace the component from the reservoir in the processing bath that decomposes at higher temperatures.

13. The apparatus as claimed in claim 8 wherein said signal source is a light source.

14. The apparatus as claimed in claim 8 wherein said output signal from said receiver is inversely proportional to the amount of bubbles.

15. Apparatus for monitoring a processing bath having a recirculation portion for recirculating a fluid mixture of hydrogen peroxide and sulfuric acid which contains bubbles during operation proportional to the ratio of hydrogen peroxide to sulfuric acid through the processing bath, comprising:

a reservoir connected to said processing bath containing hydrogen peroxide;

a metering solenoid valve connected between and metering the hydrogen peroxide from said reservoir to the recirculation portion of the processing bath;

a light source providing a light beam into the recirculation portion of the processing bath, said light beam diminished by the bubbles in the fluid mixture deflecting light from said light beam; and a photoelectric receiver receiving the diminished light from the fluid mixture in the processing bath, and said photoelectric receiver generating an output signal responsive to said light beam passing through the fluid mixture with bubbles;

an adjustment control connected to said metering solenoid valve for receiving said output signal and causing said metering solenoid valve to meter the hydrogen peroxide from said reservoir to said processing bath at a threshold signal indicative of a change in the ratio of hydrogen peroxide to sulfuric acid.

16. The apparatus as claimed in claim 15 wherein the hydrogen peroxide is used for removing organic photoresist from semiconductor wafers immersed in the processing bath and the amount of bubbles decrease as the hydrogen peroxide is used up removing the organic photoresist; and wherein said adjustment control is settable to cause said metering solenoid valve to replace the hydrogen peroxide from the reservoir in the processing bath that is used up.

17. The apparatus as claimed in claim 15 wherein the hydrogen peroxide is used for removing organic photoresist from semiconductor wafers and the amount of bubbles decrease as the fluid mixture becomes diluted by water formed while removing the organic photoresist; and wherein said adjustment control is settable to cause said metering solenoid valve to replace the hydrogen peroxide from the reservoir in the processing bath to decrease the dilution therein.

18. The apparatus as claimed in claim 15 wherein the amount of bubbles decrease as the hydrogen peroxide in the processing bath decomposes and is used up over time; and wherein said adjustment control is settable to cause said metering solenoid valve to replace the hydrogen peroxide in the processing bath that decomposes and is used up over time.

19. The apparatus as claimed in claim 15 wherein the amount of bubbles decrease as the hydrogen peroxide in the processing bath decomposes faster at higher temperatures; and wherein said adjustment control is settable to cause said metering solenoid valve to replace the hydrogen peroxide that decomposes at higher temperatures from the reservoir.

20. The apparatus as claimed in claim 15 wherein said light beam received by said receiver is inversely proportional to the amount of bubbles and the amount of hydrogen peroxide in the fluid mixture.

* * * * *